(12) United States Patent
Berry et al.

(10) Patent No.: US 7,987,400 B2
(45) Date of Patent: Jul. 26, 2011

(54) METHOD FOR OPTIMIZING SCAN CHAINS IN AN INTEGRATED CIRCUIT THAT HAS MULTIPLE LEVELS OF HIERARCHY

(75) Inventors: Christopher J. Berry, Hudson, NY (US); Lawrence David Curley, Round Rock, TX (US); Patrick James Meaney, Poughkeepsie, NY (US); Diana Lynn Orf, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 12/035,500

(22) Filed: Feb. 22, 2008

(65) Prior Publication Data

US 2009/0217115 A1    Aug. 27, 2009

(51) Int. Cl.
*G01R 31/28* (2006.01)
*G06F 17/50* (2006.01)

(52) U.S. Cl. ......... 714/726; 714/729; 716/122; 716/125
(58) Field of Classification Search .................. 714/726, 714/729; 716/122, 125
See application file for complete search history.

(56) References Cited

U.S. PATENT DOCUMENTS

| | | | |
|---|---|---|---|
| 5,717,700 A | 2/1998 | Crouch et al. | |
| 5,949,692 A | 9/1999 | Beausang et al. | |
| 6,106,568 A | 8/2000 | Beausang et al. | |
| 6,405,355 B1 | 6/2002 | Duggirala et al. | |
| 6,539,509 B1 * | 3/2003 | Teene ........................ | 714/727 |
| 6,539,536 B1 | 3/2003 | Singh et al. | |
| 6,665,828 B1 | 12/2003 | Arimilli et al. | |
| 6,681,356 B1 * | 1/2004 | Gerowitz et al. ............. | 714/729 |
| 6,862,717 B2 * | 3/2005 | Nadeau-Dostie et al. ........ | 716/4 |
| 6,968,489 B2 | 11/2005 | Motika et al. | |
| 6,986,090 B2 * | 1/2006 | Hathaway et al. ............. | 714/727 |
| 6,996,791 B2 | 2/2006 | Brunkhorst et al. | |
| 7,127,695 B2 | 10/2006 | Huang et al. | |
| 7,162,707 B2 * | 1/2007 | Kanaoka et al. .............. | 716/113 |
| 7,188,323 B2 | 3/2007 | Wang et al. | |
| 7,194,706 B2 * | 3/2007 | Adkisson et al. .................. | 716/4 |
| 7,418,640 B2 * | 8/2008 | Kapur et al. ................... | 714/726 |
| 7,657,850 B2 * | 2/2010 | Huang et al. ................... | 716/136 |
| 2003/0140293 A1 | 7/2003 | Motika et al. | |
| 2005/0114747 A1 | 5/2005 | Brunkhorst et al. | |
| 2005/0235183 A1 | 10/2005 | Wang et al. | |
| 2007/0168805 A1 | 7/2007 | Huisman et al. | |
| 2007/0186199 A1 * | 8/2007 | Fredrickson et al. ............. | 716/7 |

OTHER PUBLICATIONS

Rahimi et al., Layout Driven Synthesis of Multiple Scan Chains, Mar. 2003, IEEE, vol. 22, pp. 317-326.*

* cited by examiner

*Primary Examiner* — John J Tabone, Jr.
(74) *Attorney, Agent, or Firm* — William A. Kinnaman, Jr.

(57) ABSTRACT

A method for optimizing scan chains in an integrated circuit that has multiple levels of hierarchy addresses unlimited chains and stumps and separately all other chains and stumps. Unlimited chains and stumps are optimized by dividing an area encompassed by the chains and by a start point and an end point of the stump into a grid comprised of a plurality of grid boxes, and determining a grid box to grid box connectivity route to access all of the grid boxes between the start point and the end point by means of a computer running a routing algorithm. All other chains and stumps are optimized randomly assigning to a stump a chain that can be physically reached by that stump and adding an additional chain to that stump based on the number of latches in the additional chain, its physical location, and the number of latches already assigned.

18 Claims, 10 Drawing Sheets

OVERVIEW OF PRPG, MISR, STUMP AND CHAIN RELATIONSHIP

FIG.1
Prior Art

OVERVIEW OF DESIGN WITH PRPG/MISR

METHOD FOR OPTIMIZING SCAN CHAINS IN AN INTEGRATED CIRCUIT THAT HAS MULTIPLE LEVELS OF HIERARCHY

FIELD OF THE INVENTION

This invention relates logical built-in self test (LBIST) of integrated circuits, and more particularly to a method for determining how LBIST scan chains can be connected in an optimized path that meets timing and chain length constraints, and minimizes the wire routing among chains in an integrated circuit that has two or more hierarchical levels.

BACKGROUND OF THE INVENTION

Figure 1:
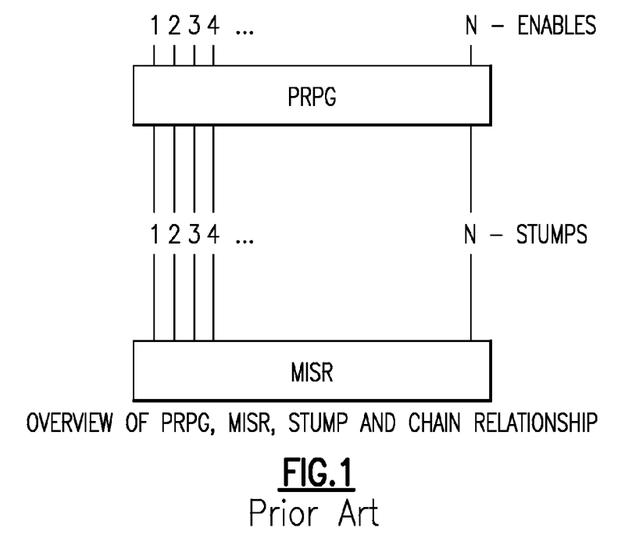
FIG. 1 is a block diagram of typical LBIST system.

Logical Built-in Self Test of integrated circuits is well known and widely used in the art of production testing of integrated circuits (IC) in order to detect and isolate any faults in the IC. FIG. 1 is a block diagram of a typical LBIST system. A pseudo-random pattern generator (PRPG) generates a pseudo-random pattern of data that is coupled as inputs to a number of parallel scan chains 1 through "N". Each chain is comprised of a series of latches. Test data is fed into the first latch in a chain on each scan chain clock cycle and on each scan chain clock cycle the data in the proceeding latch in the chain is shifted to the succeeding latch in the chain. This procedure continues until all of the latches in the chain are loaded with data. Once all of the latches have been loaded, a functional clock is applied to the circuit under test. In a typical LBIST system the outputs of the chains in response to the functional clock is coupled to a multiple input signature register (MISR), which compresses the data and provides a data signature that can be compared with a known good signature. Scan chains are also referred to in the art as STUMPS, which is an acronym for Self-Test Using MISR and Pseudo-random pattern generator. As used herein the connections from the PRPG to the MISR are referred to as stumps. The cells (e.g. Macros and Units) are referred to as chains and the latches reside inside of each of these chains.

Figure 2:
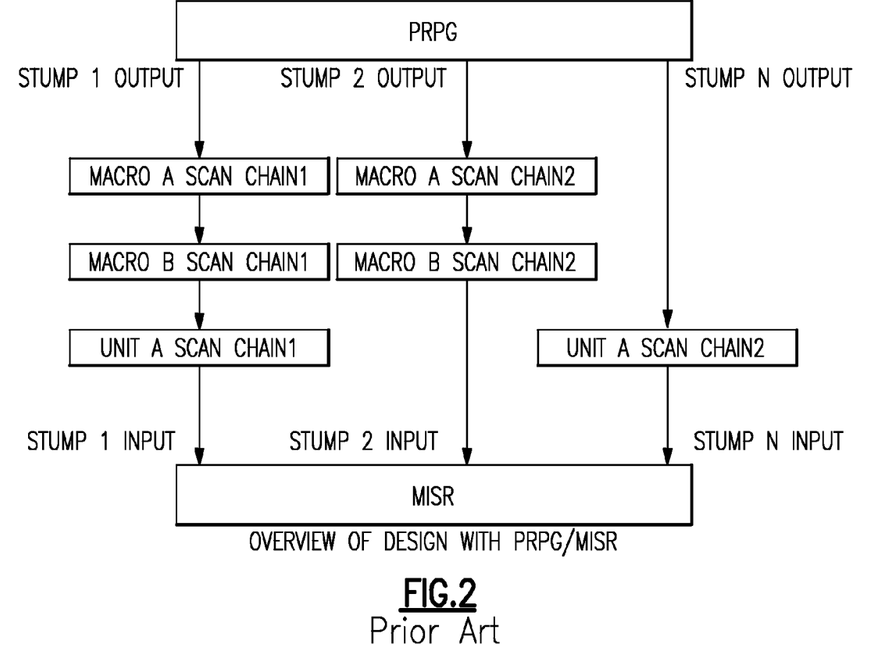
FIG. 2 is a block diagram of the system of FIG. 1 illustrating the inclusion of chains in stumps.

FIG. 2 is a block diagram of a typical LBIST system for testing an IC with several hierarchical levels. In this illustrative example, a stump 1 path comprises LBIST type 1 chains included in Macro A, Macro B, and Unit A coupled in series; a stump 2 path comprises type 2 chains included in Macro A and Macro B coupled in series; and stump N comprises a type 2 chain in Unit A.

Figure 3:
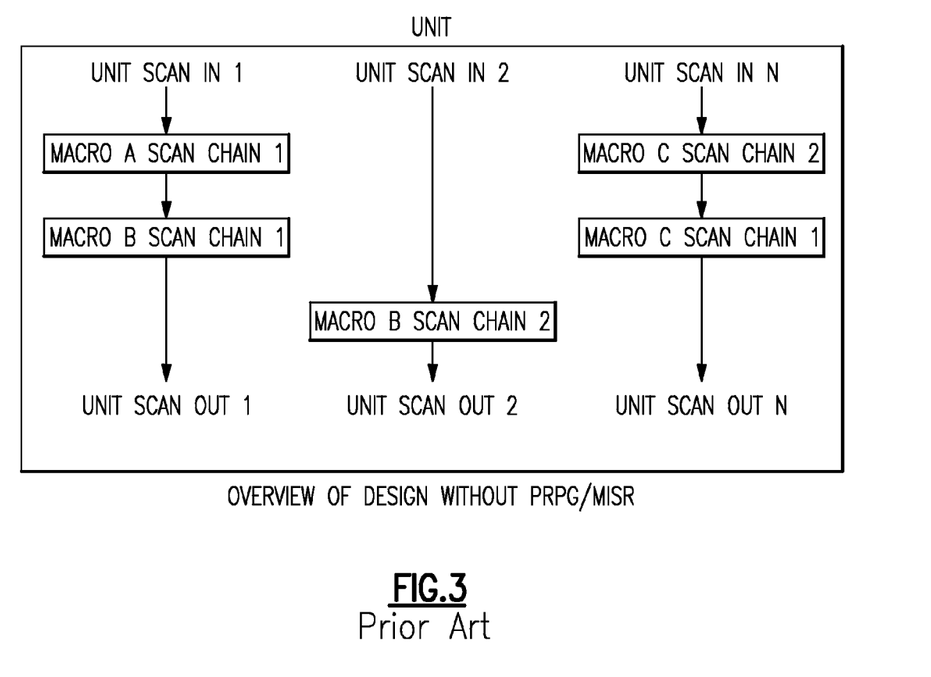
FIG. 3 is a block diagram similar to FIG. 2 but illustrating a more general case in respect of generating inputs and capturing outputs.

FIG. 3 is a block diagram similar to FIG. 2 in illustrating the fact that, in some test systems in use, the input to each stump in some systems is not generated by a PRPG and the output is not captured by a MISR.

The connections between the PRPG and the MISR have both logical and physical constraints. These connections, which make up hundreds or thousands of nets in an IC, can cause timing and routing issues. There are timing restrictions on the connections that go from the MISR/PRPG to the chains, between the chains, and from the chains to the MISR/PRPG.

SUMMARY OF THE INVENTION

An object of this invention is the provision of a method to identify optimum scan chain combinations for each stump by combining and segregation of different stump types and chain types.

Another object of this invention is the provision of a method that segregates, selects, and assigns chains to stumps based on scan able regions and the ability of the stump to propagate a signal through the stump within an allotted cycle time.

Briefly this invention contemplates the provision of a method for optimizing scan chains in an integrated circuit that has multiple levels of hierarchy in which the optimization process addresses unlimited chains and stumps and separately all other chains and stumps. Unlimited chains and stumps are optimized by dividing an area encompassed by the chains and by a start point and an end point of the stump into a grid comprised of a plurality of grid boxes, and determining a grid box to grid box connectivity route to access all of the grid boxes between the start point and the end point by means of a computer running a routing algorithm. All other chains and stumps are optimized randomly assigning to a stump a chain that can be physically reached by that stump and adding an additional chain to that stump based on the number of latches in the additional chain, the physical location of the additional chain, and the number of latches in the chain already assigned to the stump.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 7 is a flow chart of the method steps to implement block 104 of FIG. 4; while

DETAILED DESCRIPTION OF THE INVENTION

Figure 4:
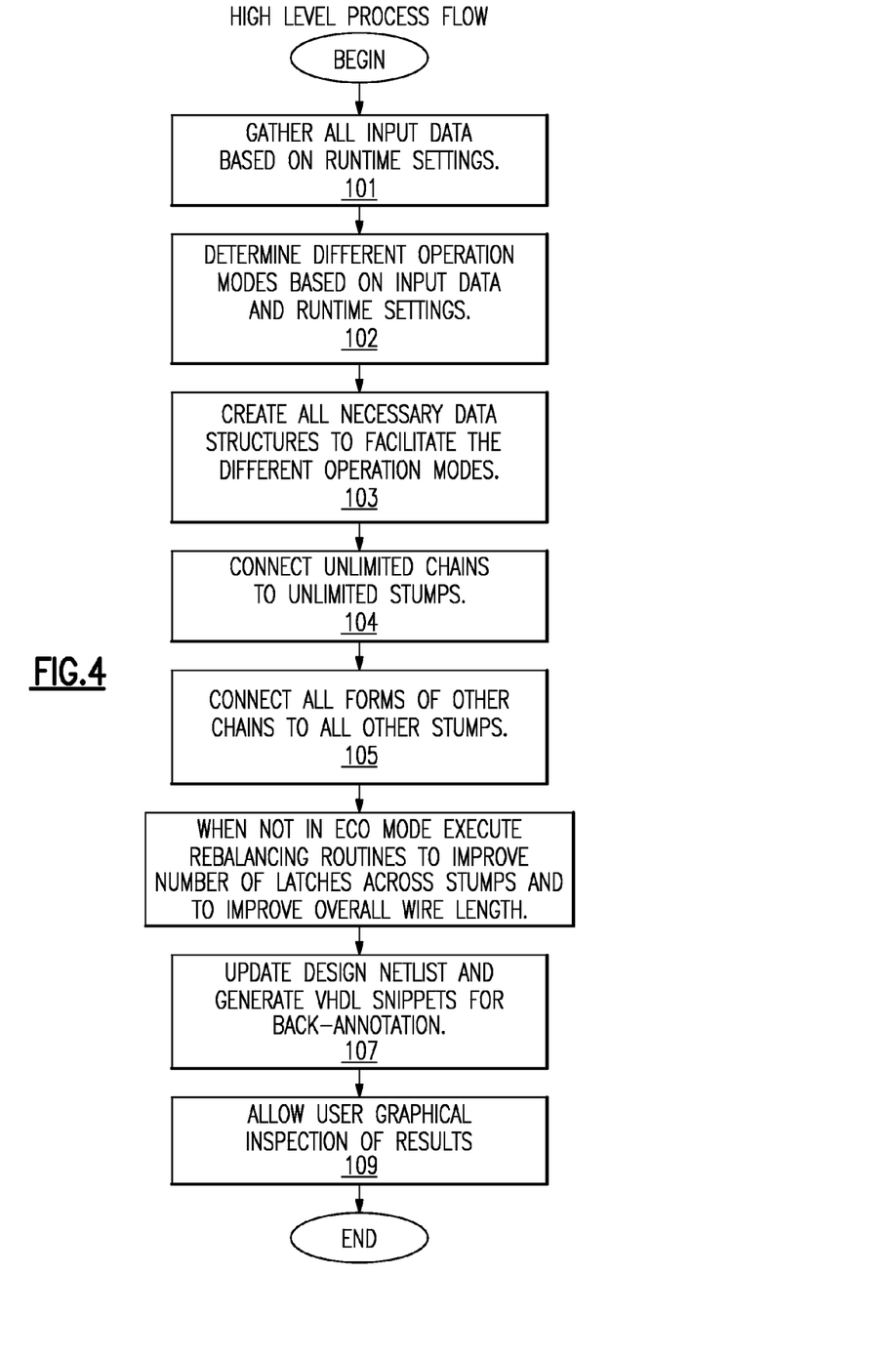
FIG. 4 is a flow chart of one embodiment of the method steps in accordance with the teachings of this invention.
Figure 5:
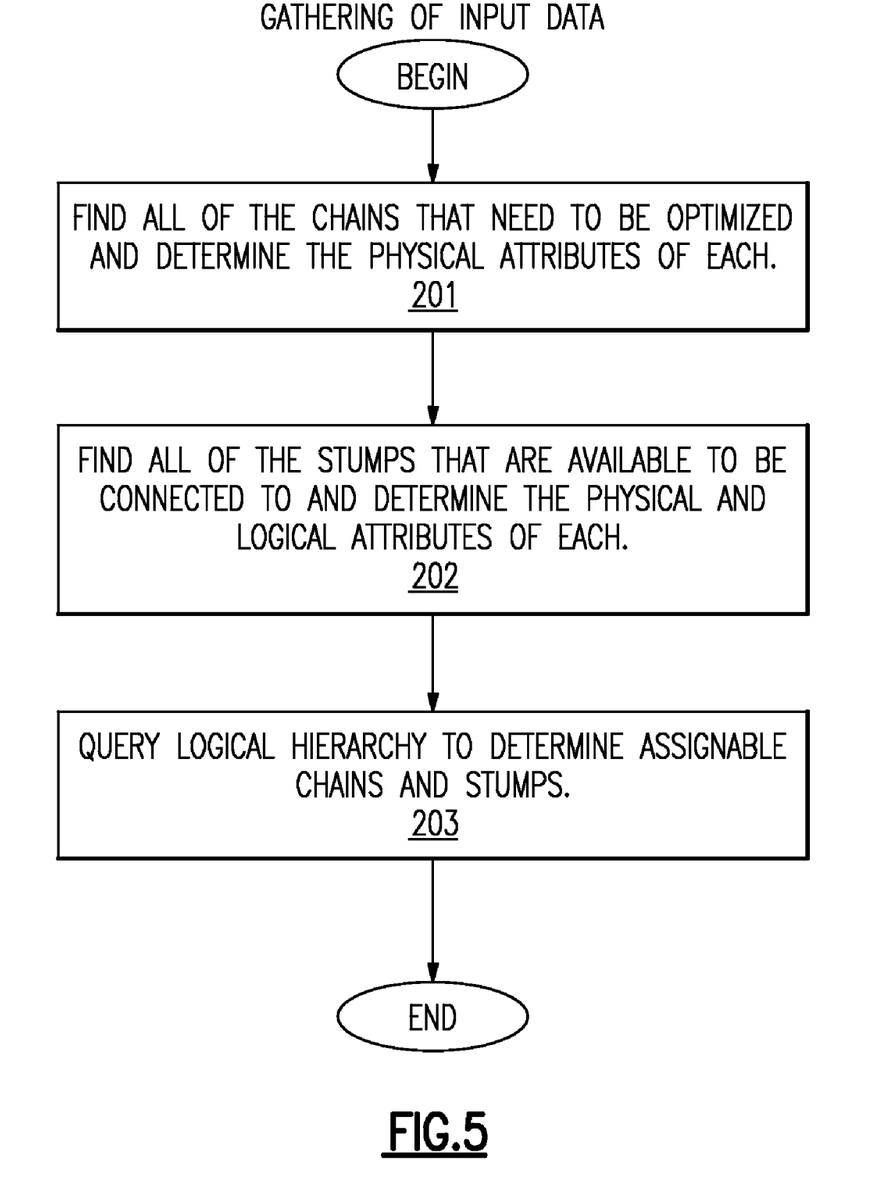
FIG. 5 is a flow chart of the method steps to implement block 101 of FIG. 4.

Referring now to FIG. 4, the process starts at step 101 by gathering input data based on runtime settings. This step is explained in more detail in FIG. 5, and begins at step 201 by finding all of the chains that need to be optimized and determining the physical attributes of each of these chains. Next in step 202, the process determines all of the stumps that are available to be connected to and determines the physical and logical attributes of each stump. The logical hierarchy of the macros and units of the IC are examined to which chains can be assigned to which stumps, step 203.

Figure 6:
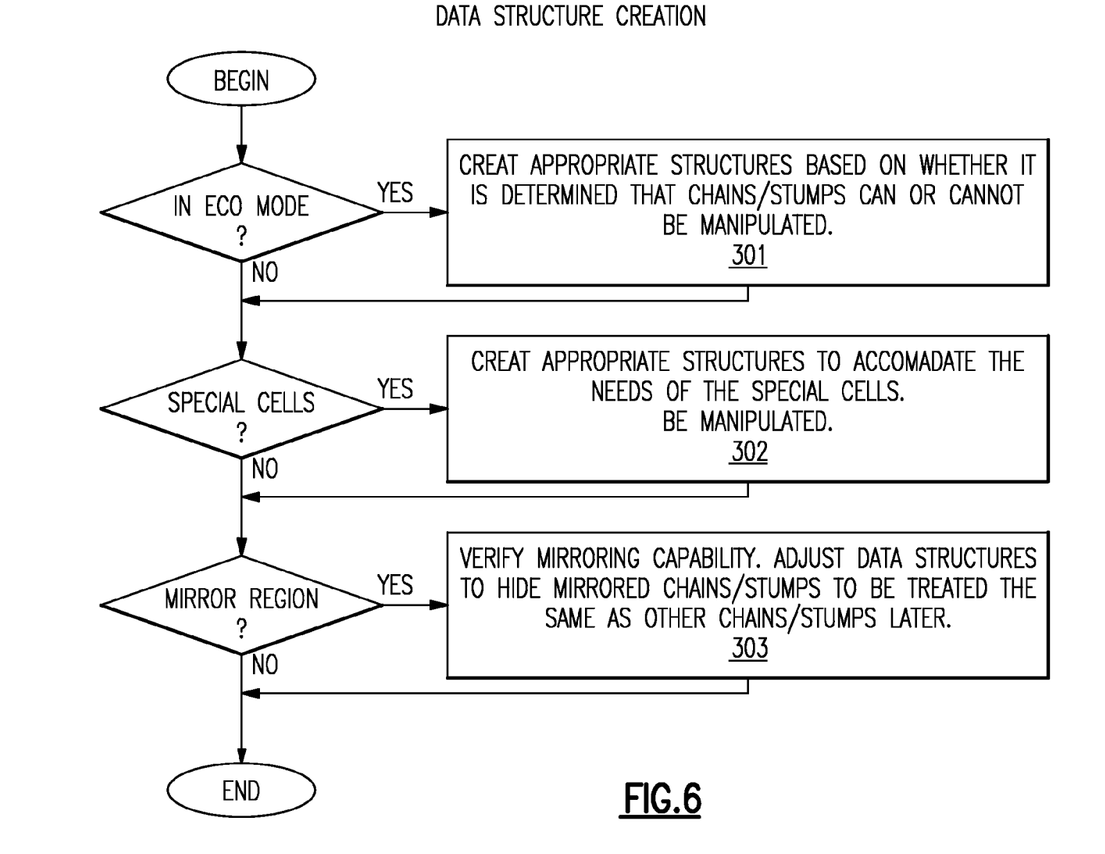
FIG. 6 is a flow chart of the method steps to implement block 103 of FIG. 4.

Referring back to FIG. 4, the next step 102 determines the respective operating modes of the chains based on input data and runtime settings. The input data is the vhdl file that is the source for the database the tool runs on. It is also the database itself and different situations in the database cause the tool to react differently. The runtime settings are set by the user in a GUI or command line from which the tool is run. Those settings are used to tell the tool to operate in ECO mode, what types of outputs to create, what types of optimization steps to run, etc. It also allows the user to specify the parameters that allow the tool to identify a stump or a chain, how the different types of chains/stumps are identified, etc. Next, all necessary data structures are created to facilitate the different operations modes at step 103. This data structure creation step is shown in more detail in FIG. 6. If the IC design is in a mode that permits Engineering Change Orders (ECO mode) appropriate chain/stump structures are created based on whether the chain/stump structures can or cannot be manipulated, step 301. If the cell is a special cell, that is a cell that cannot be changed or edited, appropriate chain/stump structures are created to accommodate the needs of the special cells, step 302. In a region of the IC that mirrors another region, so that an identical chain/stump structure can be used in both, the mirroring capability is verified. The data structure is adjusted to hide mirrored chain/stumps to be treated later the same as the other mirrored chain/stumps, step 303.

Figure 7:
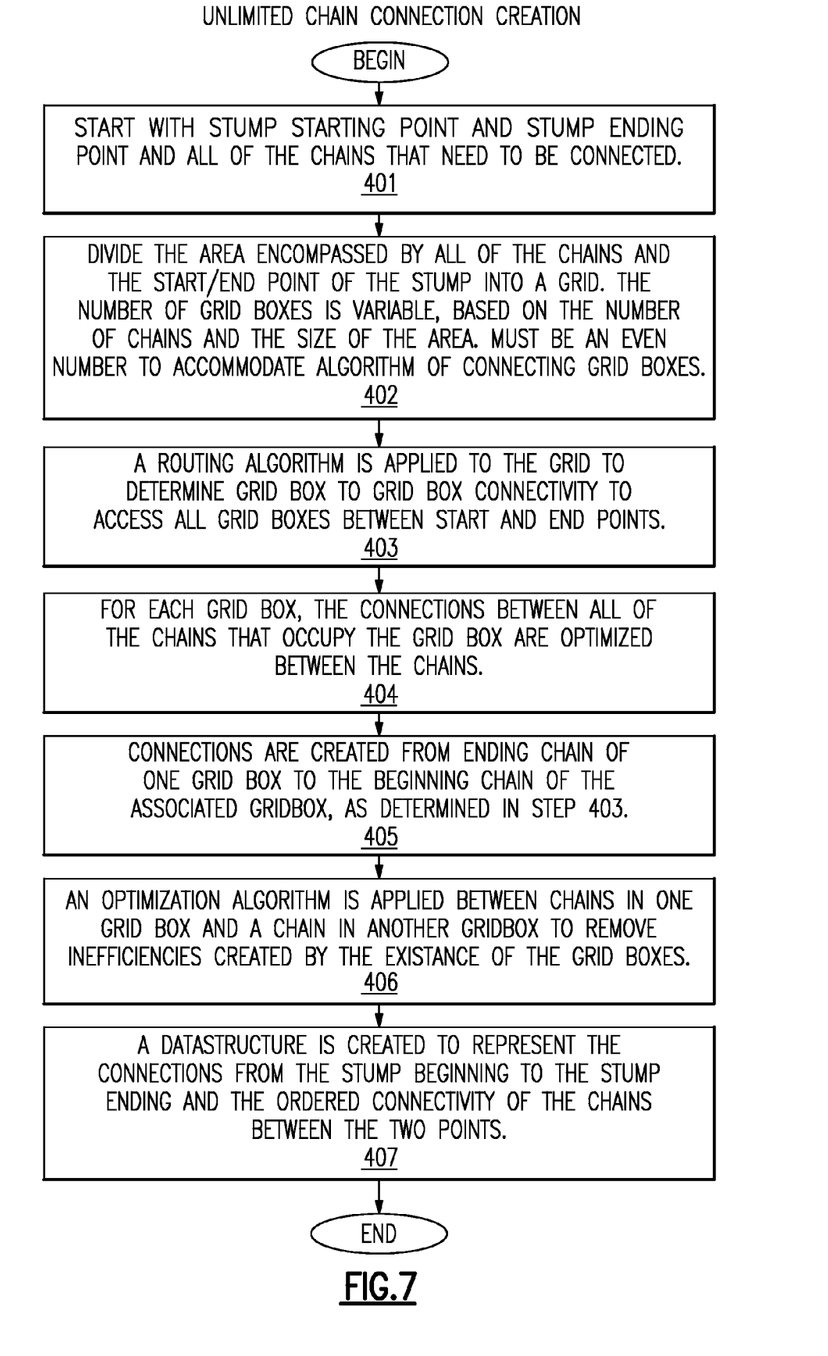
Figure 8:
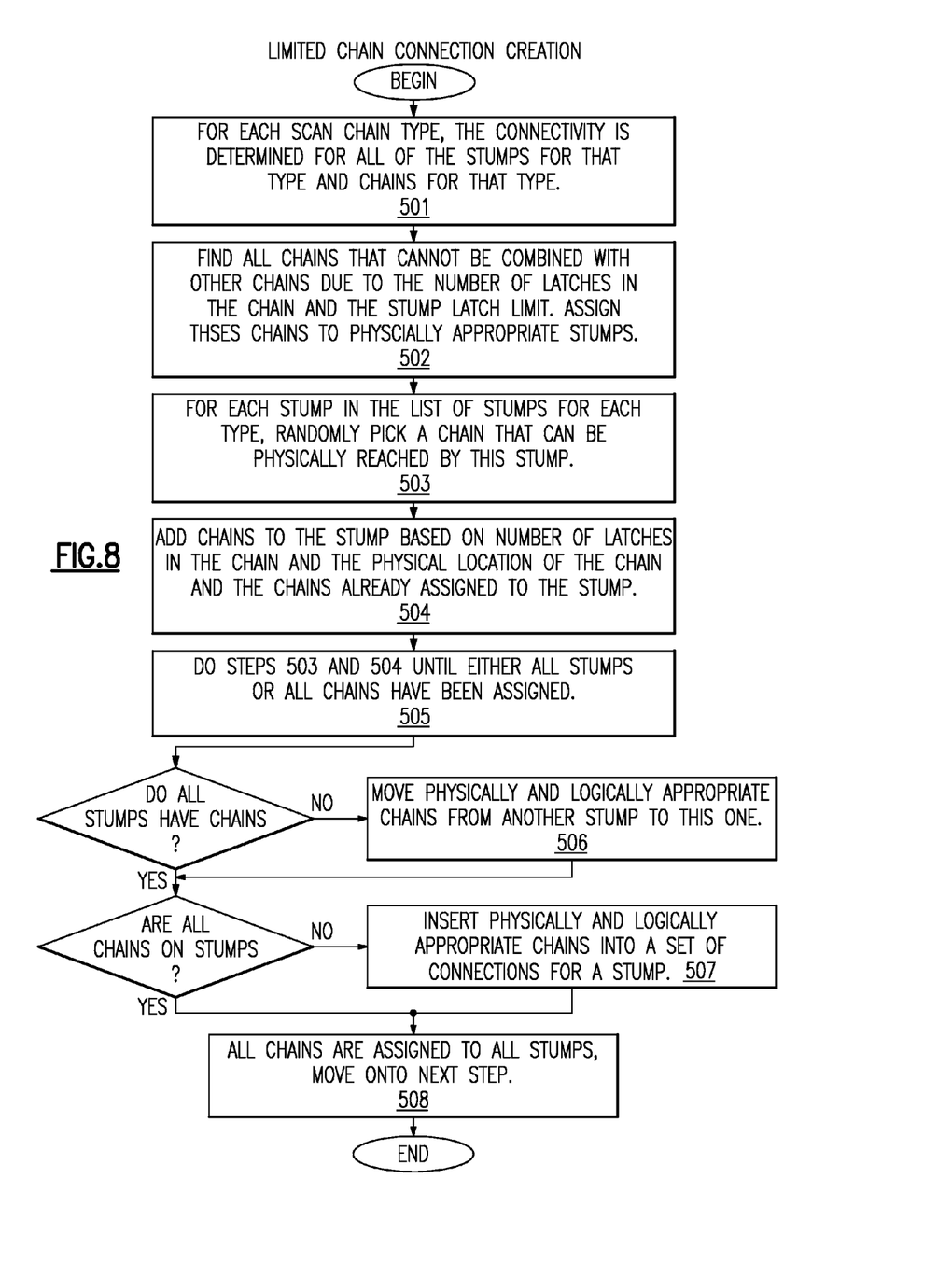
FIG. 8 is a flow chart of the method steps to implement block 105 of FIG. 4.
Figure 11:
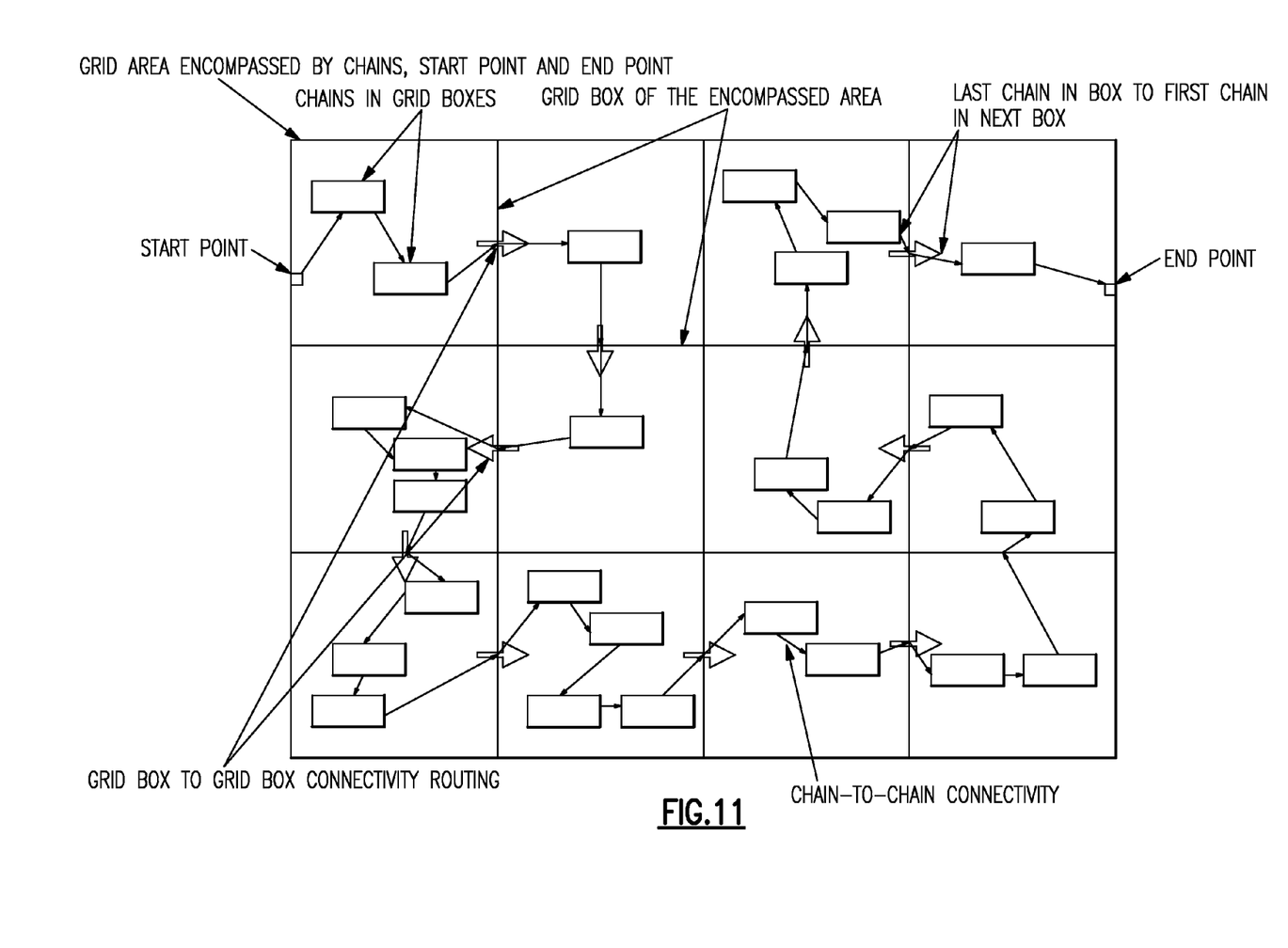
FIG. 11 shows the example of the FIG. 7 step 407 data structure.

Again referring to FIG. 4, the next step 104 is to connect unlimited chains to unlimited stumps. Unlimited stumps and unlimited chains are differentiated from other chains and stumps by their type. Certain types that are found in the design are unlimited and the rest are not, which step is described in detail in FIG. 7. Starting with the data defining the starting and ending point of the stump and the unlimited chains that need to be connected (step 401), the area encompassed by all of the chains and the start/end points of the stump are divided into a grid of smaller areas, step 402. The number of grid box areas is variable, and depends upon the number of chains and the size of the overall area. The number of grid box areas is even to accommodate the connection of grid box areas. A routing algorithm is applied to the grid box areas to determine the grid box to grid box connections in order to access all grid boxes between the stump start and end points. For each grid box, the connections between all of the chains in that grid box are optimized, step 404. Step 405 creates connections from the ending chain of one grid box to the beginning chain of the grid box next in the stump as had been determined in step 403. An optimization algorithm can be applied between chains in one grid box and chains in another grid box to remove some of the inefficiencies created by the existence of the gird boxes, step 406. Step 407 creates a data structure to represent the connections from the stump beginning to the stump ending and the ordered connectivity of the chains between these two points. An example of the step 407 data structure is shown in FIG. 11 which shows the described grid area encompassed by latch chains between a start point and an end point. The encompassed chains include chains, shown by the shaded blocks, in a grid box of the encompassed area grid. The last chain in a grid box has connectivity to a chain in a next box. There is grid box to grid box connectivity of chains and between chains within a grid box, shown by the connection arrows there between for connectivity routing. There is chain-to-chain connectivity routing between the chains encompassing all of the chains of the grid box, and to other chains of other boxes of the grid area of step 407. The next step 105 of FIG. 4, is to connect all forms of chains and stumps other than unlimited chains and stumps. This process step is shown in detail in FIG. 8. The process determines connectivity for each scan chain type and for all stumps for that type, step 501. First in this process, chains that cannot be combined with other chains due to the number of latches in the chain and the stump latch limit are assigned to physically appropriate stumps, step 502. For chains of this type that can be combined, a chain is randomly picked that can be physically reached by a given stump, step 503. Next, in step 504, chains are added to this stump based on the number of latches in the chain and the number of latches already assigned to the stump so the combined number of latches does not exceed latch number limitations, and the physical location of the chain so that its inclusion does not violate timing constraints. Steps 503 and 504 are repeated until all stumps or all chains have been assigned, step 505. If all stumps do not have chains, physically and logically appropriate chains from another stump are moved to the stump without chains, step 506. If there are chains not assigned to a stump those chains without stumps are inserted in between a set of connections on a stump that doesn't create any violations, step 507.

Figure 9:
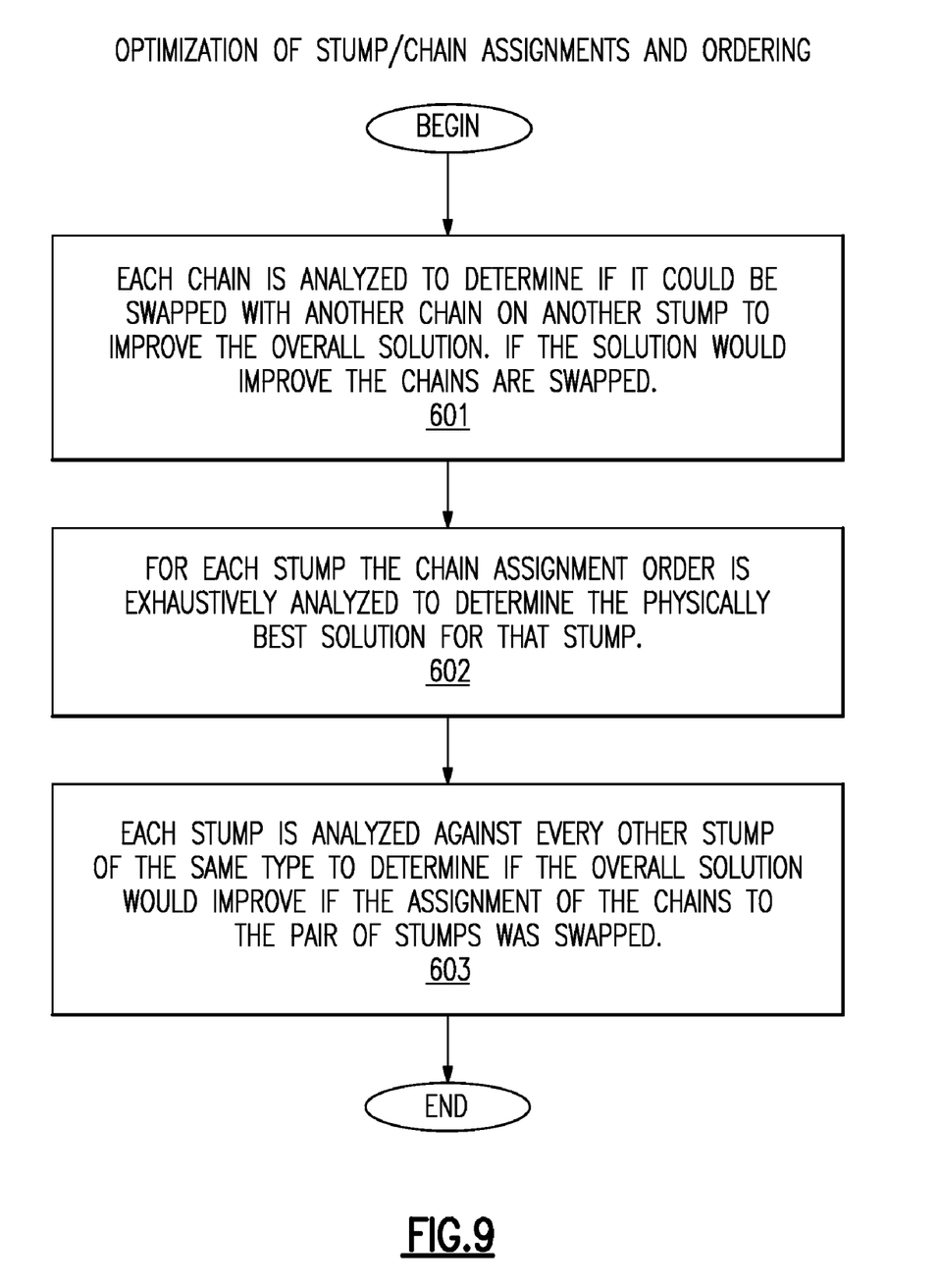
FIG. 9 is a flow chart of the method steps to implement block 106 of FIG. 4.

In step 106 rebalancing routines are executed to improve the balance of the number of latches in each stump and to improve the overall wiring length. FIG. 9 shows these process steps in detail. Each chain is analyzed to determine if it could be swapped with another chain on another stump to improve the overall solution. If it does, the chains are swapped, step 601. For each stump, the assigned chain order is analyzed to determine the physically best solution for that stump, step 602. Each stump is analyzed against every other stump of the same type to determine if the overall solution would be improved if the assignment of the chains to the pair of stumps were swapped, step 603.

Figure 10:
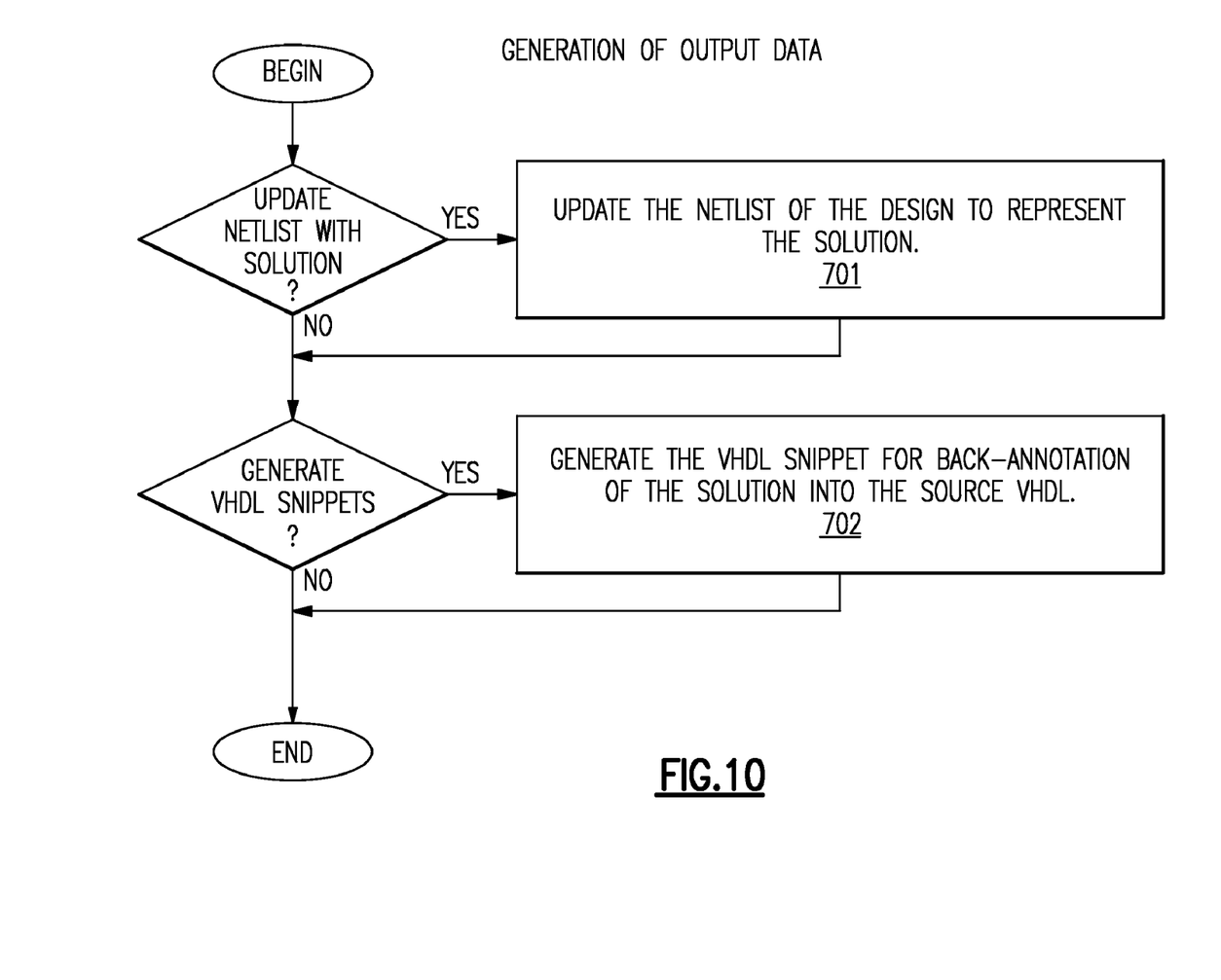
FIG. 10 is a flow chart of the method steps to implement block 107 of FIG. 4.

In step 107 the design net list is updated with the solution generated in steps 101 through 106, and vhdl snippets are generated for back-annotation to the source vhdl, as shown in more detail in FIG. 10. In step 109 a graphic map of the solution is generated to allow visual inspection of the result.

Alternative Embodiment

In addition to and independent of the described embodiment for optimizing scan chains, further optimization can occur at the system level by leveraging changes at the macro level. For instance, supposed that there are 20 macros each with 600 latches of a particular type. This would be represented in FIG. 2 as Macro A Chain 1, Macro B Chain 1, etc. Suppose the stump length limit is 1024 latches. This would mean that none of the 20 chains could be combined with any other chain since 600 latches in one macro combined with 600 latches in another macro would create a stump length of 1200 latches, thus exceeding the limit. The minimum number of stumps for these 20 macros of 1 chain each with 600 latches per chain would be 20 stumps. Since each stump has the ability to support 1024 latches, the efficiency of the design would be (20*600)/(20*1024)=about 59%.

This further optimization consists of limiting the scan rings within macros to a smaller granularity. For example, if the stump length were still 1024 but the macro chain length was limited to 256 latches, there would be less overall stumps required, thus saving area. For this example, each of the 20 macros would have two chains of 256 latches each in addition to an additional chain of 88 latches (600=256+256+88). After applying these new stumps to the invention, the stumps would get optimized as (256+256+256+256)=1024. There would be 10 such stumps of 1024 each. Furthermore, the remaining 20 macro chains of 88 bits each could get optimized as (88*10 macros) for one stump and (88*10 macros) for a second additional stump. With a stump total of 10+2=12, the efficiency would be:

$$(600*20)/(12*1024)=\text{about 98\%}.$$

A further extension of this technique is to avoid major rip-up of the optimized invention. This would allow more cases where ECO mode can be used. For instance, if all the chains that use 256 bits (maximum loaded chains) were named or flagged differently than the ones that were partial chains, the fully connected chains would remain pretty stable. Any macro synthesis could be made to first use the max config chains and then to put remaining latches on the extra chain. In the example, if the number of latches in a macro increased or decreased from the 600, the only chain affected would be the one with 88 latches. The two groups of 256 would remain optimized as 256 bits as long as the number of latches did not change by a significant amount (<88).

In addition, the 'extra' chain, the one with 88 bits, can be treated as a max count. If that is done, the invention would treat all subchains as the maximum they could inhabit. In this example, the chains with 88 bits would all be treated as up to 256 bits for the optimization calculations. This can be done in the step of gathering all input data in FIG. 4, step 101. In this example, the chains with 88 bits would be treated as 256 so only four of the 88-bit chains would be connected to the same stump. There would be 10 stumps of 1024 (256+256+256+256) and 5 stumps of (88+88+88+88) for a total of 15 stumps. The optimization would be:

$$(600*20)/(15*1024)=\text{about } 78\%.$$

It is recommended that the method to implement this alternative embodiment include the steps:

At the system level:
1. Determining the largest scan length allowed for the system. (e.g. 1024)
2. Determining a granularity required to achieve the optimization level desired. (e.g. 256)
3. Choosing a convention as to how to 'fill' the macro-based chains for consistency. (e.g. tagging non-full chains with an ECO attribute)

At the macro level:
4. Determine the total number of latches on each TYPE of scan chain.
5. Dividing that chain up into smaller chain lengths, limited to the granularity. (e.g. 256)
6. Following the 'fill' consistency rules.

Optionally, the extra step of
1a. Determining if additional staging latches are needed in each chain for support and reducing the allowed scan length by that amount.

The capabilities of the present invention can be implemented in software, firmware, hardware or some combination thereof. As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided. The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method for assigning scan chains to a STUMP in a hierarchical IC using program code embodied on a non-transitory computer readable medium, including the steps of:
differentiating unlimited chains of a design for said hierarchical IC having certain types of chains that are of an unlimited type and which are differentiated from others that are of a limited type, and identifying unlimited chains so differentiated that need to be connected to an unlimited STUMP;
defining with data of said design a start point and an end point of the unlimited STUMP to which the unlimited chains need to be connected;
circumscribing a physical area occupied by the identified unlimited chains of said design and by the start point and the end point of the unlimited STUMP with a rectangular physical bounding box and dividing said box into a grid comprised of a plurality of smaller grid boxes of smaller areas;
determining a grid box to grid box connectivity route to access the plurality of smaller grid boxes between the start point and the end point by means of a computer running a routing algorithm;
determining a chain to chain connectivity route among the identified unlimited chains in each smaller grid box;
determining a connectivity route routing a connection between an ending unlimited chain in one smaller grid box and a beginning unlimited chain in an associated smaller grid box to connect the start point and the end point of the unlimited STUMP;
randomly assigning to a limited STUMP a limited chain that can be physically reached by the limited STUMP for connecting the limited chain to the limited STUMP; and
adding an additional limited chain to the limited STUMP based on a number of latches in the additional limited chain and a number of latches already assigned to the limited STUMP such that a combined number of latches does not exceed a latch number limitation, and based on a physical location of the additional limited chain such that inclusion of the additional limited chain does not violate timing constraints.

2. The method for assigning scan chains to a STUMP as in claim 1, including the step of moving unlimited chains from one grid box to another grid box.

3. The method for assigning scan chains to a STUMP as in claim 2, including the step of creating a database to represent connections from said start point to said end point of said unlimited STUMP and connections of unlimited chains between the start point and the end point of said unlimited STUMP.

4. The method for assigning scan chains to a STUMP as in claim 3, including the step of updating a net list for the IC to represent the unlimited STUMP and the connections of unlimited chains.

5. The method for assigning scan chains to a STUMP as in claim 1, including the step of creating a database to represent connections from said start point to said end point of said unlimited STUMP and connections of unlimited chains between the start point and the end point of said unlimited STUMP.

6. The method for assigning scan chains to a STUMP as in claim 1, including the step of moving limited chains already assigned to a limited STUMP to a new limited STUMP with no assigned limited chain based on their physical proximity and logical compatibility to one another.

7. The method for assigning scan chains to a STUMP as in claim 1, including the steps of analyzing an assignment of chains to STUMPs and swapping chains between STUMPs when a result of the analyzing step indicates a swap.

8. The method for assigning scan chains to a STUMP as in claim 1, including the step of connecting limited chains and limited STUMPs, by steps including:
   determining connectivity for said limited chains and said limited STUMPs;
   assigning limited chains that cannot be combined with other limited chains in a limited STUMP due to a number of latches in the limited chains and a latch limit for the limited STUMP to other limited STUMPs that can be physically reached;
   repeating an assignment of limited chains and limited STUMPs until all of the limited STUMPs or all of the limited chains have been assigned; and
   moving limited chains already assigned to a limited STUMP to a new limited STUMP with no assigned limited chain if all of the limited STUMPs do not have limited chains.

9. The method for assigning scan chains to a STUMP as in claim 8, including the steps of analyzing an assignment of chains to STUMPs and swapping chains between STUMPs when a result of the analyzing step indicates a swap.

10. The method for assigning scan chains to a STUMP as in claim 9, including the step of creating a database to represent connections from a start point to an end point of each of said STUMPs and connections of chains between the start points and the end points of the STUMPs.

11. A method for assigning scan chains to a STUMP in a design for a hierarchical IC using program code embodied on a non-transitory computer readable medium, including the steps of:
   circumscribing a physical area occupied by identified unlimited chains of said design and by a start point and an end point of a first STUMP with a rectangular physical bounding box and dividing said box into a grid comprised of a plurality of smaller grid boxes of smaller areas;
   determining a grid box to grid box connectivity route to access the plurality of smaller grid boxes between the start point and the end point of said first STUMP by means of a computer running a routing algorithm;
   determining a chain to chain connectivity route among the identified unlimited chains in each smaller grid box;
   determining a connectivity route routing a connection between an ending unlimited chain in one smaller grid box and a beginning chain in an associated smaller grid box to connect the start point and the end point of the first STUMP; and
   randomly assigning to a limited STUMP a limited chain that can be physically reached by the limited STUMP; and
   adding an additional limited chain to the limited STUMP based on a number of latches in the additional limited chain and a number of latches already assigned to the limited STUMP such that a combined number of latches does not exceed a latch number limitation, and based on a physical location of the additional limited chain such that inclusion of the additional limited chain does not violate timing constraints.

12. The method for assigning scan chains to a STUMP as in claim 11, including a step of moving unlimited chains from one grid box to another grid box.

13. The method for assigning scan chains to a STUMP as in claim 11, including the step of creating a database to represent connections from said start point to said end point of said unlimited STUMP and connections of unlimited chains between the start point and the end point of said unlimited STUMP.

14. The method for assigning scan chains to a STUMP as in claim 11, including the step of moving limited chains already assigned to a limited STUMP to a new limited STUMP with no assigned chain.

15. The method for assigning scan chains to a STUMP as in claim 14, including the steps of analyzing an assignment of chains to STUMPs and swapping chains between STUMPs when a result of the analyzing step indicates a swap.

16. The method for assigning scan chains to a STUMP as in claim 15, including the steps of creating a database to represent connections from said start point to said end point of said unlimited STUMP and connections of chains between the start point and the end point of said unlimited STUMP.

17. A method of assigning scan chains to a STUMP in a design for a system using program code embodied on a non-transitory computer readable medium, comprising the steps of:
   at a system level:
      determining a largest allowed scan length for the system;
      determining a granularity required to achieve a desired optimization level;
      choosing a convention as to how to mark populated macro-based chains for consistency; and
   at a macro level:
      determining a total number of latches on each type of limited chain;
      dividing limited chains up into smaller chain lengths, limited to the granularity; and then
      applying consistency rules to assign limited chains to limited STUMPs based on a determination of a number of latches assigned to a type;
   circumscribing a physical area occupied by identified unlimited chains of said design and by a start point and an end point of an unlimited STUMP with a rectangular physical bounding box and dividing said box into a grid comprised of a plurality of smaller grid boxes;
   determining a grid box to grid box connectivity route to access the plurality of smaller grid boxes between the start point and the end point of said unlimited STUMP by means of a computer running a routing algorithm to achieve the desired optimization level; and,
   determining a chain to chain connectivity route among the identified unlimited chains in each smaller grid box;
   determining a connectivity route routing a connection between an ending unlimited chain in one smaller grid box and a beginning unlimited chain in an associated smaller grid box to connect the start point and the end point of the unlimited STUMP.

18. The method according to claim 17, comprising further a step of determining if additional staging latches are needed in each chain for support and, if so, then reducing the allowed scan length.

* * * * *